United States Patent
Nguyen et al.

(10) Patent No.: US 9,184,651 B2
(45) Date of Patent: Nov. 10, 2015

(54) CURRENT DETECTION AND EMULATION CIRCUIT, AND METHOD THEREOF

(71) Applicant: Monolithic Power Systems, Inc., San Jose, CA (US)

(72) Inventors: James H. Nguyen, San Jose, CA (US); Francis C. Yu, Sunnyvale, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 99 days.

(21) Appl. No.: 14/170,177

(22) Filed: Jan. 31, 2014

(65) Prior Publication Data

US 2015/0222171 A1 Aug. 6, 2015

(51) Int. Cl.
*G05F 1/00* (2006.01)
*H02M 1/08* (2006.01)
*H02M 3/156* (2006.01)
*G01R 19/00* (2006.01)

(52) U.S. Cl.
CPC .............. *H02M 1/08* (2013.01); *G01R 19/0092* (2013.01); *H02M 3/156* (2013.01)

(58) Field of Classification Search
CPC  H02M 3/156; H02M 1/08; H02M 2001/0009
USPC ......... 323/205, 265, 271, 272, 282, 284, 288, 323/311, 312; 363/21.01, 21.09, 363/21.14–21.16
See application file for complete search history.

(56) References Cited

U.S. PATENT DOCUMENTS 8,203,323 B2 * 6/2012 Wicht et al. ................... 323/285
2014/0239925 A1 * 8/2014 Tanabe et al. ................. 323/271

* cited by examiner

*Primary Examiner* — Adolf Berhane
*Assistant Examiner* — Afework Demisse
(74) *Attorney, Agent, or Firm* — Perkins Coie LLP

(57) ABSTRACT

A current detection circuit for detecting a current in a SMPS which has a first switch and a second switch; a current sensing circuit sensing a second switch current flowing through the second switch and providing a current sensing signal; and a current emulation circuit which generates a first current according to the current sensing signal and generate a second current according to the first current source, and the current emulation circuit further providing a current emulation signal based on the first current source and the second current source; wherein a current detection signal during a first period is proportional to the current emulation signal, and the current detection signal during a second period is proportional to the current sensing signal.

20 Claims, 8 Drawing Sheets

CURRENT DETECTION AND EMULATION CIRCUIT, AND METHOD THEREOF

TECHNICAL FIELD

The present invention generally relates to electrical circuit, and more particularly but not exclusively relates to current detection circuit for detecting inductor current in a switching mode power supply.

BACKGROUND

Switching Mode Power Supply (SMPS) is widely used for converting an input voltage to an output voltage and supplying a load due to its many advantages such as high efficiency, high current carrying ability and so on. A SMPS has at least one power switch, and the output voltage is regulated at least by controlling the ON and OFF actions of the power switch. A SMPS may comprise a buck converter, a boost converter, a flyback converter and so on.

At times, a current flowing through the output stage is required to be detected. For example, when a short condition occurs, the current flowing through a power switch or another component is higher than a maximum current limit, the power switch or the component will be damaged. Accordingly the current is required to be detected for short protection.

FIG. 1 illustrates a prior art buck converter with inductor current detecting. Buck converter comprises a high-side switch 11, a low-side switch 12, an inductor 13 and an output capacitor 14. Since inductor 13 has a parasitic resistance RI, the current flowing through inductor 13 is sensed by sensing the Direct Current (DC) voltage across inductor 13 by using serially coupled resistor 15 and capacitor 16. However, this sensing method is not accurate due to the variation of inductor resistance RI. And furthermore, the sensed voltage VS across capacitor 16 changes with temperature.

Accordingly, an improved inductor current detection circuit is required to at least address one or some of the above deficiencies.

SUMMARY

Some embodiments of the present invention provide a current detection circuit for providing a current detection signal indicative of an inductor current in a SMPS, the current detection circuit comprising a current sensing circuit and a current emulation circuit, wherein the current sensing circuit is coupled to a switch of the SMPS for sensing the current flowing through the switch and generates a current sensing signal, and the current emulation circuit generates a current emulation signal for emulating the inductor current based on the current sensing signal. The current detection signal is determined by the current sensing signal when it is able to indicate the inductor current accurately, and is determined by the current emulation signal in the remainder time.

In one embodiment, a current detection circuit for detecting a current in a SMPS is disclosed. Wherein the SMPS has a first switch and a second switch, and the current equals a first switch current flowing through the first switch when a PWM signal is in a first state and equaling a second switch current flowing through the second switch when the PWM signal is in a second state different from the first state. The current detection circuit provides a current detection signal indicative of the current in the SMPS, and the current detection circuit comprises: a current sensing circuit for sensing the second switch current, the current sensing circuit having a first input, a second input and an output, wherein the first input of the current sensing circuit is coupled to a first end of the second switch, the second input of the current sensing circuit is coupled to a second end of the second switch, and the output of the current sensing circuit is configured to provide a current sensing signal indicative of the second switch current; and a current emulation circuit having an input and an output, wherein the input of the current emulation circuit is configured to receive the current sensing signal, and the output of the current emulation circuit is configured to provide a current emulation signal, wherein the current emulation circuit provides a first current generated based on the current sensing signal and provides a second current generated based on the first current, and further wherein the current emulation signal is generated based on the first current and the second current; wherein the current detection signal is proportional to the current emulation signal with a predetermined proportion during a first period, and is proportional to the current sensing signal with the same predetermined proportion during a second period, and wherein the second period is complementary to the first period.

In another embodiment, a current emulation circuit for emulating an inductor current in a SMPS and providing a current emulation signal based on a current sensing signal is disclosed. The SMPS has a first switch, a second switch and an inductor coupled to the first switch and the second switch, wherein the inductor current flowing through the inductor equals a first switch current flowing through the first switch when a PWM signal is in a first state and equals a second switch current flowing through the second switch when the PWM signal is in a second state different from the first state, wherein the current sensing signal is indicative of the second switch current. The current emulation circuit comprises: a converting circuit having an input and an output, wherein the input of the converting circuit is configured to receive the current sensing signal, and the output of the converting circuit is configured to provide a first current, and wherein the first current is proportional to the slope of the current sensing signal; a signal generating circuit configured to provide a second current based on the first current; and a switching network configured to charge a capacitor by the second current when the PWM signal is in the first state and accordingly the current emulation signal increases, and the switching network configured to discharge the capacitor by the first current when the PWM signal is in the second state and accordingly the current emulation signal decreases.

In yet another embodiment, a method of detecting an inductor current in a SMPS comprises: sensing a current flowing through a switch of the SMPS by a current sensing circuit to get a current sensing signal; generating a first current based on the slope of the current sensing signal; generating a second current based on the first current; generating a current emulation signal according to the first current and the second current; and detecting the inductor current by adopting the current emulation signal in a first period and adopting the current sensing signal in a second period.

The current emulation signal according to some embodiments of the present invention does not need trimming and is continuous during switching transition, and may emulate the inductor current with high accuracy. And the current detection circuit according to some embodiments of the present invention provides a current detection signal indicative of a current in a SMPS with high accuracy.

BRIEF DESCRIPTION OF THE DRAWINGS

Non-limiting and non-exhaustive embodiments are described with reference to the following drawings. The drawings are only for illustration purpose. Usually, the drawings only show part of the systems or circuits of the embodiments.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some embodiments according to the present invention detect a current by sensing a current flowing through one switch to get a sensed signal during a first period, and by emulating the current according to the sensed signal during a second period.

Figure 1:
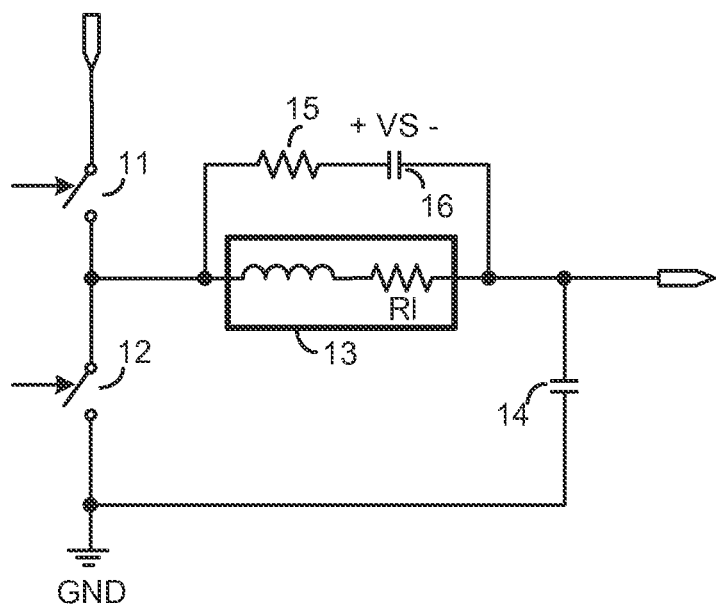
FIG. 1 illustrates a prior art buck converter with inductor current detecting.
Figure 2:
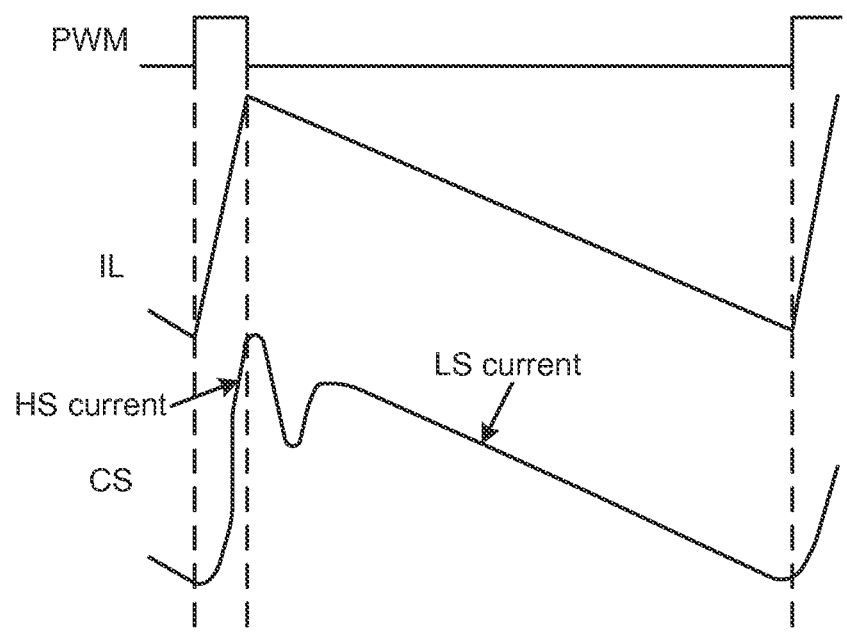
FIG. 2 shows a waveform diagram illustrating a prior method of sensing inductor current in a buck converter.

FIG. 2 shows a waveform diagram illustrating a prior method of sensing inductor current in a buck converter. When the PWM signal is in HIGH logic state, the high-side switch is turned on, and the current IL flowing through the inductor increases. At this time, a current sensing signal CS indicating the inductor current equals a high-side current signal HS sensed by a first current sensing circuit which is coupled across the high-side switch. When the PWM signal is in LOW logic state, the low-side switch is turned on and the current IL flowing through the inductor decreases. At this period, current sensing signal CS equals a low-side current signal LS sensed by a second current sensing circuit which is coupled across the low-side switch. Thus, this method requires two current sensing circuits and a lot of external components. And both the signals HS and LS need to be trimmed which do not match the real inductor current IL. Furthermore, signals HS and LS during switching transition are not continuous and have high fluctuation which further lowers down the detecting accuracy. Accordingly, an improved current detection circuit is required.

Figure 3:
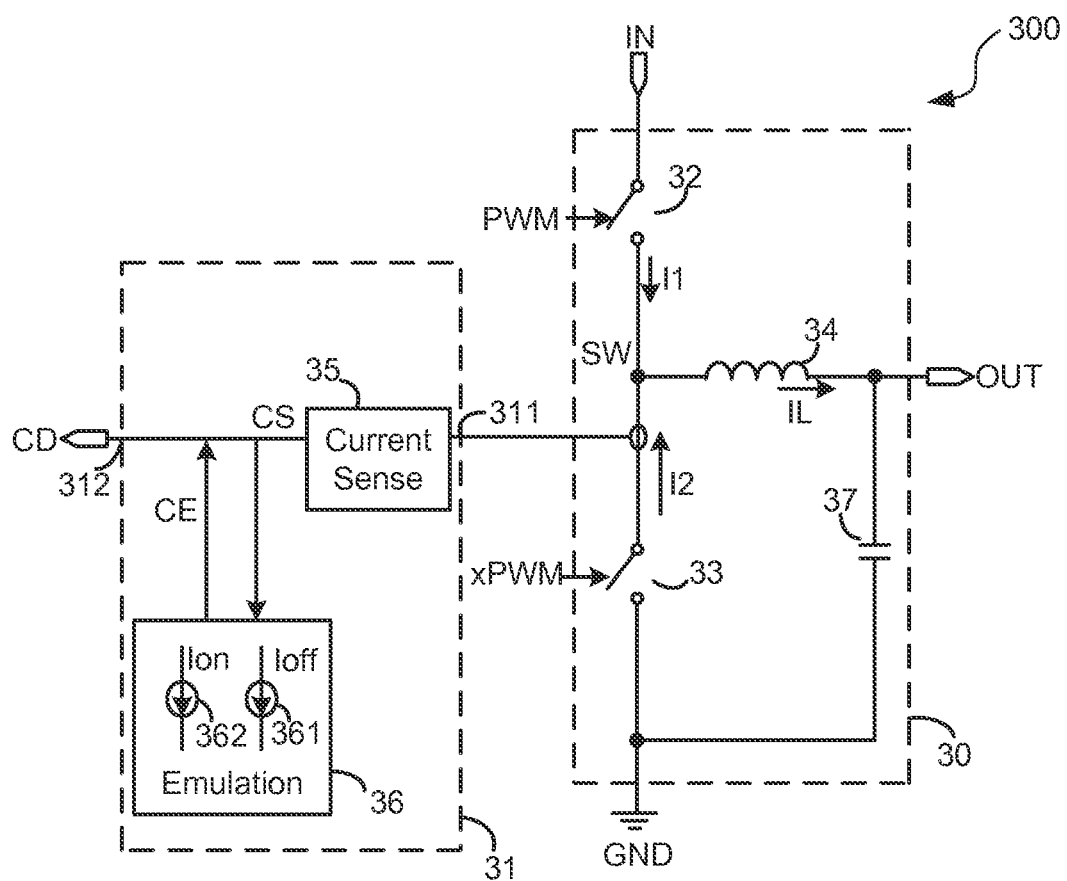
FIG. 3 illustrates a SMPS 300 according to an embodiment of the present invention.

FIG. 3 illustrates a current detection circuit 31 for detecting an inductor current IL flowing through an inductor 34 of a SMPS 300 according to an embodiment of the present invention. SMPS 300 comprises a switching circuit 30 and the current detection circuit 31. Switching circuit 30 comprises a first switch 32, a second switch 33, an inductor 34 and an output capacitor 37. In the shown embodiment, switching circuit 30 comprises a buck converter. In detail, the first switch 32 is a high-side switch or called main switch coupled between an input node IN and a switching node SW, the second switch 33 is a low-side switch coupled between switching node SW and a reference ground GND, the inductor 34 is coupled between switching node SW and an output node OUT, and the output capacitor 37 is coupled between output node OUT and the reference ground GND to provide an output voltage. In one embodiment, the first switch 32 and the second switch 33 each comprise a transistor, for example a Metal Oxide Semiconductor Field Effect Transistor (MOSFET). The first switch 32 is controlled by a PWM signal, and the second switch 33 is controlled by a signal xPWM which is in a complementary pattern of the PWM signal, or a NOT signal of the PWM signal. Thus, when the PWM signal is in a first logic state for example in logic HIGH, signal xPWM is in logic LOW, the first switch 32 is turned on and the second switch 33 is turned off, and current flows from input node IN to the first switch 32 and then to the inductor 34. During this time period, an inductor current IL which flows through inductor 34 equals a first switch current I1 which flows through the first switch 32, and a second switch current I2 which flows through the second switch 33 is zero. At the same time, inductor current IL increases. And when the PWM signal is in a second logic state for example in logic LOW, signal xPWM is in logic HIGH, the first switch 32 is turned off and the second switch 33 is turned on, and current flows from reference ground GND to the second switch 33 and then to inductor 34. During this time period, inductor current IL equals the second switch current I2, and the first switch current I1 is zero. And at the same time, inductor current IL decreases. In one embodiment, the second switch 33 comprises a non-synchronous diode.

Current detection circuit 31 is used to detect inductor current IL. Current detection circuit 31 has an input 311 coupled to the second switch 33, and an output 312 providing a current detection signal CD. Current detection circuit 31 comprises a current sensing circuit 35 configured to sense the second switch current I2 and a current emulation circuit 36 which emulates inductor current IL when the sensed signal of second switch current I2 is not suitable for indicating inductor current IL. Current sensing circuit 35 has an input coupled to the second switch 33, and an output providing a current sensing signal CS. In one embodiment, current sensing signal CS is a voltage signal which is proportional to the second switch current I2. Current sensing circuit 35 may use any possible current sensing circuit.

Current emulation circuit 36 has an input configured to receive current sensing signal CS and an output configured to provide a current emulation signal CE. Current emulation circuit 36 provides a first current source 361 having a value of a first current Ioff according to current sensing signal CS, and provides a second current source 362 having a second current Ion according to the first current Ioff of the first current source 361. In one embodiment, the first current source 361 is derived that current Ion is proportional to the slope of current sensing signal CS. And in one embodiment, the second current Ion of the second current source 362 is determined by the first current Ioff of the first current source 361 by an equation that: Ion=Ioff (Toff/Ton), wherein Toff is the time when the PWM signal is in the second logic state (e.g. logic LOW) and Ton is the time when the PWM signal is in the first logic state (e.g. logic HIGH). And accordingly Ion=Ioff(1−D)/D, where D represents the duty cycle of the PWM signal. In one embodiment, current emulation signal CE is generated by charging a capacitor by the second current source 362 when the PWM signal is in the first logic state and discharging the capacitor by the first current source 361 when the PWM signal is in the second logic state. In one embodiment, the output of current sensing circuit 35 and the output of the current emulation circuit 36 are coupled such that a switch selectively couples the current sensing signal to the output of the current detection circuit 31 or couples the current emulation signal to the output of the current detection circuit 31.

Current detection signal CD is proportional to current emulation signal CE with a predetermined proportion during a first period, and current detection signal CD is proportional to current sensing signal CS with the same predetermined proportion during a second period. In one embodiment, the second period is when current sensing signal CS is indicative of inductor current IL, and the first period is the remainder period other than the second period. And in one embodiment, the second period comprises the time when the second switch is in ON state. And in one embodiment, the second period comprises a part of the time when the PWM signal is in the second logic state, or the time when the second switch is in ON state, and the second period comprises the time when the PWM signal is in the first logic state and the time at the beginning of when the PWM signal transits into the second logic state. In one embodiment, current detection signal CD equals current sensing signal CS or current emulation signal CE, and the predetermined proportion equals 1.

SMPS 300 may further comprise a controller for generating a Pulse Width Modulation (PWM) signal for controlling the first switch 32 and the second switch 33 based on the current detection signal CD and/or the output voltage. In one embodiment, the duty cycle of the PWM signal increases when the current detection signal CD indicating the inductor current IL increases. In one embodiment, when the current detection signal CD is higher than a threshold, the first switch 32 and the second switch 33 are turned off. But for ease of illustration, the controller is not shown without departing from the spirit of the present invention as defined in the appended claims.

In one embodiment, switching circuit comprise a boost converter. And accordingly the first switch comprises a high-side switch of the boost converter, and the second switch comprises a low-side switch of the boost converter.

Figure 4:
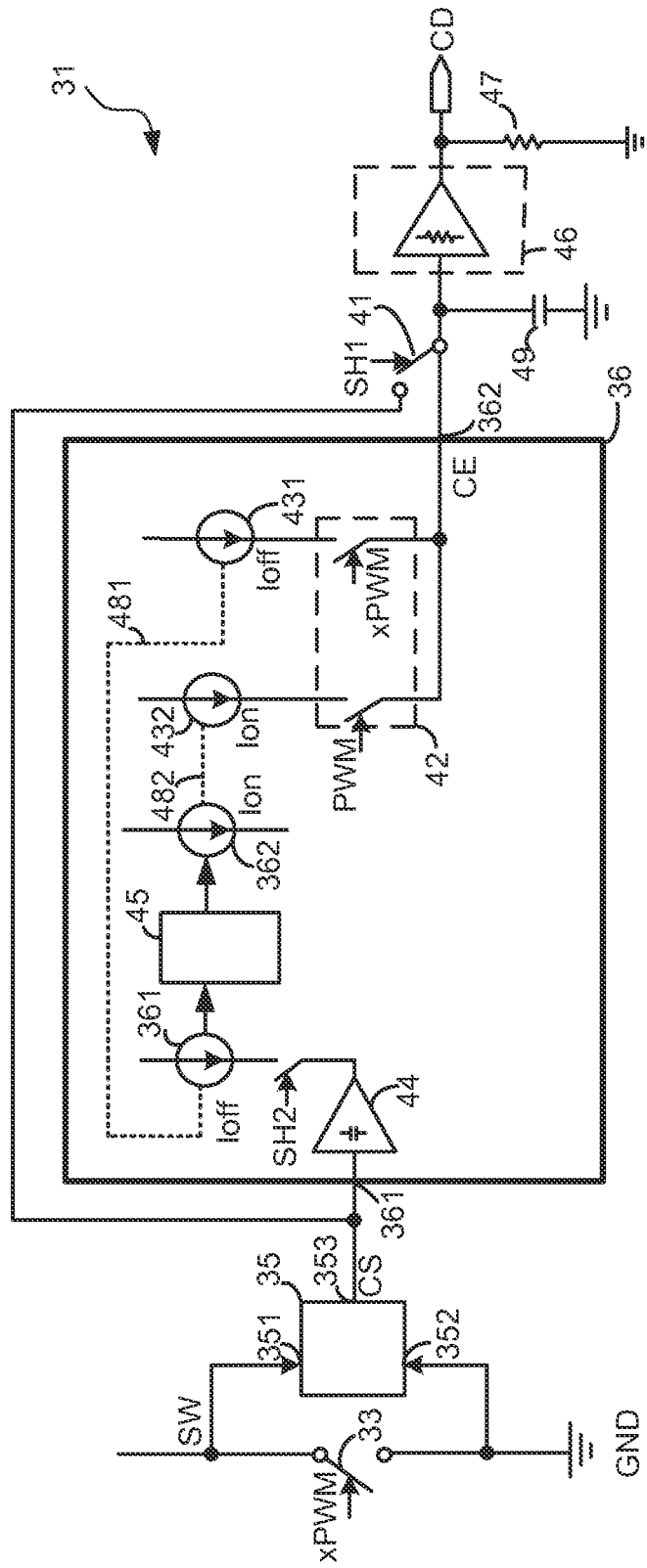
FIG. 4 illustrates a current detection circuit 31 according to an embodiment of the present invention.

FIG. 4 illustrates a current detection circuit 31 according to an embodiment of the present invention. Current detection circuit 31 comprises a current sensing circuit 35, a current emulation circuit 36, a selection switch 41, a capacitor 49, a transconductance amplifier 46 and a resistor 47.

Current sensing circuit 35 has a first input 351, a second input 352 and an output 353, wherein the first input 351 of current sensing circuit 35 is coupled to a first end of the second switch 33 and a switching node SW, the second input 352 of current sensing circuit 35 is coupled to a second end of the second switch 33, and the output 353 is coupled to transconductance amplifier 46 via selection switch 41. Current sensing circuit 35 is configured to sense a second switch current flowing through a second switch 33 and generate a current sensing signal CS. In one embodiment, current sensing signal CS is proportional to the second switch current. When the second switch 33 is turned on, the second switch current flowing through it equals the inductor current, and thus current sensing signal CS during this time is proportional to the inductor current.

Selection switch 41 controlled by a signal SH1 is used to select either the current sensing signal CS or the current emulation signal CE for generating current detection signal CD. During a first time period, signal SH1 is in a first state, selection switch 41 couples current emulation signal CE to the input of transconductance amplifier 46. And during this time period, current detection signal CD is determined by current emulation signal CE. During a second time period, signal SH1 is in a second state, selection switch 41 couples the output 353 of current sensing circuit 35 to transconductance amplifier 46. And at this time, current detection signal CD is determined by current sensing signal CS.

Current emulation circuit 36 has an input 361 and output 362. Wherein input 361 is coupled to output 353 of current sensing circuit 35. Input 361 of current emulation circuit 36 is configured to receive current sensing signal CS. And output 362 of current emulation circuit 36 is configured to provide the current emulation signal CE. In one embodiment, current sensing signal CS and the current emulation signal CE each is a differential voltage between a positive voltage and a negative voltage with reference to a reference ground, and capacitor 49 may be replaced with two capacitors.

Current emulation circuit 36 comprises a converting circuit 44, a signal generating circuit 45, a plurality of current mirrors 481 and 482 and a switching network 42. Converting circuit 44 has an input and an output, and wherein the input of converting circuit 44 is configured to receive the current sensing signal CS, and the output of converting circuit 44 is configured to provide a first current source 361 having a first current Ioff. And in one embodiment, the first current Ioff is proportional to a slope rate of current sensing signal CS and indicates the slope rate of current sensing signal CS. Converting circuit 44 outputs a first current Ioff to form a first current source 361.

Signal generating circuit 45 provides the second current source 362 having a second current Ion which is generated based on the first current Ioff of the first current source 361. In one embodiment, the second current Ion is determined by Ion=Ioff*(Toff/Ton), where Toff is the time that the inductor current decreases, and Ton is the time that inductor current IL increases.

A plurality of current mirrors 481 and 482 mirror the first current source 361 into at least one first current Ioff and mirror the second current source 362 into at least one second current Ion.

Switching network 42 comprises a plurality of switches. When the PWM signal is in a first logic state for example in logic HIGH, switching network 42 controls that the second current Ion charges capacitor 49, and accordingly the current emulation signal CE increases. And when the PWM signal is in a second logic state, for example logic LOW, signal xPWM is in logic HIGH, and switching network 42 controls that the first current Ioff discharges capacitor 49 such that the current emulation signal CE decreases.

Transconductance amplifier 46 has an input coupled to output 362 of current emulation circuit 36 and/or output 353 of current sensing circuit 35 via selection switch 41 for selectively receiving current sensing signal CS or current emulation signal CE, and the output of transconductance amplifier 46 is configured to provide a current signal. Transconductance amplifier 46 converts current emulation signal CE into the current signal which is proportional to current emulation signal CE when signal SH1 is in the first state, and converts current sensing signal CS into a current signal which is proportional to current sensing signal CS when signal SH1 is in the second state.

Capacitor 49 has a first end coupled to the input of transconductance amplifier 46 and has a second end coupled to the reference ground GND. In one embodiment, when signal SH1 is in a first state, selection switch 41 disconnect from the output 353 of current sensing circuit 35, and current emulation circuit 36 charges capacitor 49 by the second current Ion or discharges capacitor 49 by the first current Ioff to form current emulation signal CE. And when signal SH1 is in a second state, selection switch 41 connect input of transconductance amplifier 46 to the output 353 of current sensing circuit 35, the voltage at the input of transconductance amplifier 46 equals current sensing signal CS. In another embodiment, selection switch has a control end coupled to signal SH1, a first end coupled to input of transconductance amplifier 46, and has a second end selectively coupled to either the output of current emulation circuit 36 when signal SH1 is in a first state, or to the output of current sensing circuit 35 when signal SH1 is in a second state.

Resistor 47 has a first end and a second end, wherein the first end of resistor 47 is coupled to the output of the transconductance amplifier 46 and the second end of resistor 47 is coupled to the reference ground GND. Resistor 47 converts the current signal provided by transconductance amplifier 46 into a voltage signal at the first end of resistor 47. Where the voltage signal at the first end of resistor 47 forms current detection signal CD.

During a first period when selection switch 41 couples current emulation signal CE to transconductance amplifier 46, current detection signal CD is proportional to the current emulation signal CE which changes according to the first current Ion or the second current Ioff with a predetermined proportion. During a second period when switch 41 couples current sensing signal CS to transconductance amplifier 46, current detection signal CD is proportional to the current sensing signal CS with the same predetermined proportion. And this predetermined proportion is determined by the parameters of transconductance amplifier 46 and resistor 47. In one embodiment, transconductance amplifier 46 has a transconductance gain of gm, and the resistance of resistor 47 is R, and the predetermined proportion is gm*R.

In another embodiment, transconductance amplifier 46 and resistor 47 may be eliminated. And current detection signal CD equals current emulation signal CE during the first period and current detection signal CD equals current sensing signal CS during the second period. In this situation, the predetermined proportion equals 1.

In another embodiment, the current detection circuit does not comprise selection switch 41, and current emulation signal CE is used for further control e.g. controlling the PWM signal directly. In one embodiment, a current emulation circuit is manufactured in an electrical package. And in one embodiment, a current emulation circuit further comprises transconductance amplifier 46 and resistor 47 for generating a current emulation signal, wherein the current emulation signal may be used for further control, e.g. for generating the PWM signal directly.

Figure 5:
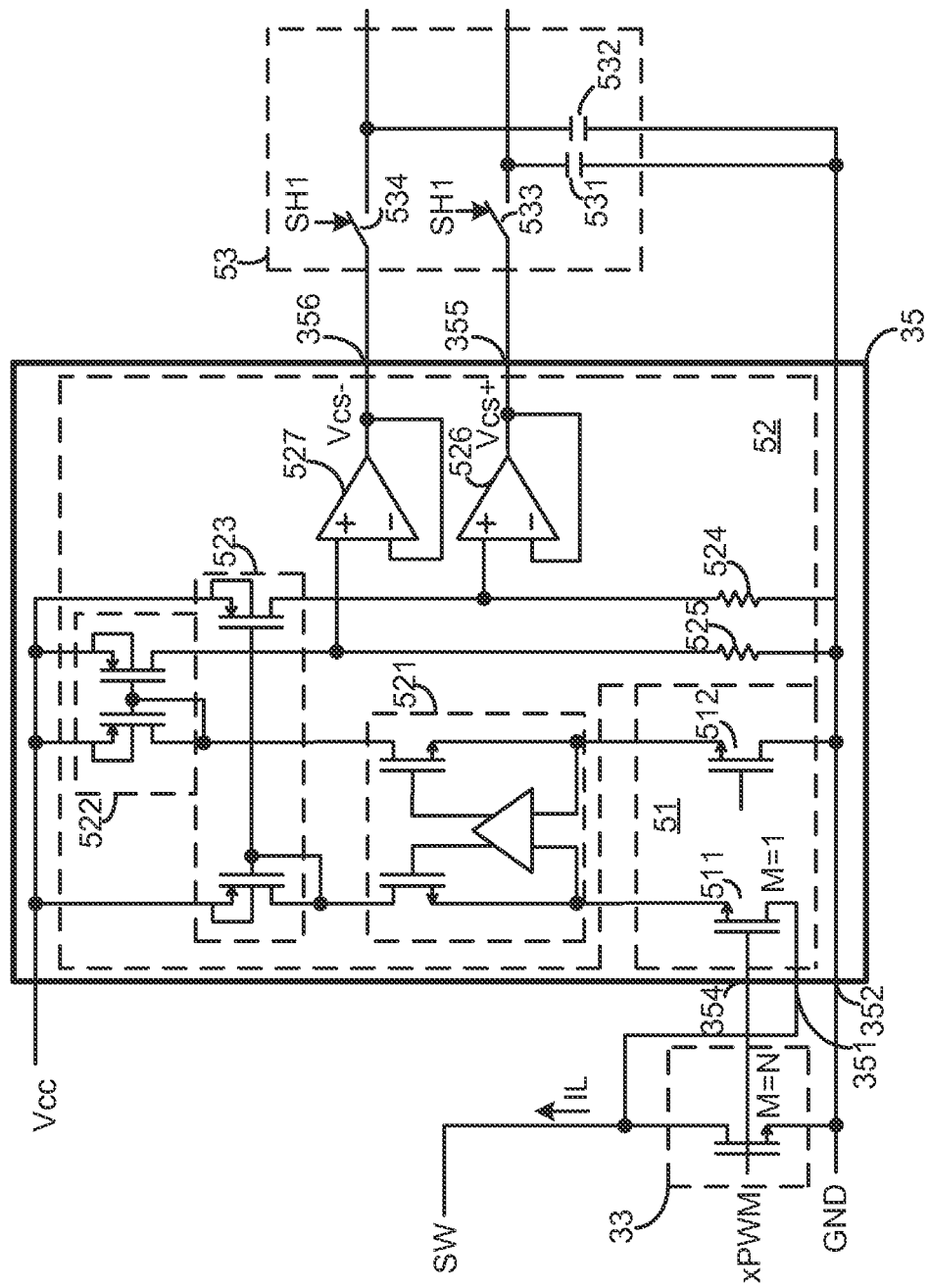
FIG. 5 illustrates a circuit diagram including a current sensing circuit 35, according to an embodiment of the present invention.

FIG. 5 illustrates a circuit diagram including a current sensing circuit 35 and a sample and hold circuit 53 according to an embodiment of the present invention. Current sensing circuit 35 outputs a current sensing signal in differential form. Current sensing circuit 35 has a first input 351 coupled to a first end of the second switch 33 and a switching node SW, a second input 352 coupled to a second end of the second switch 33 and a reference ground GND, a third input 354 coupled to a signal xPWM, a first output 355 configured to provide a positive current sensing voltage Vcs+, and a second output 356 configured to provide a negative current sensing voltage Vcs−. Wherein the current sensing signal is the differential voltage between the positive current sensing voltage Vcs+ and the negative current sensing voltage Vcs, which can be indicated as Vcs=(Vcs+)−(Vcs−).

Current sensing circuit 35 comprises a sensing transistor module 51 and a sensing amplifier 52. Sensing transistor module 51 comprises a first sensing switch 511 and a second sensing switch 512. In one embodiment, sensing transistor module 51 is fabricated on the same semiconductor substrates with the second switch 33. Sensing transistor module 51 has a first end coupled to the first end of the second switch 33 and the switching node SW, a second end coupled to the second end of the second switch 33 and reference ground GND, a third end coupled to the control end of the second switch 33 to receive signal xPWM, and a fourth end and a fifth end coupled to current amplifier 52. The low-side switch 33 comprises N transistors coupled in parallel, while the first sensing switch 511 and the second sensing switch 512 each comprises 1 transistor, where N is an integral number. And accordingly the on conduction resistance of the first sensing switch 511 or the on conduction resistance of the second sensing switch 512 is N times of the on conduction resistance of the second switch 33. The first sensing switch 511 has a first end coupled to switching node SW, a control end receiving signal xPWM and a second end coupled to one input of sensing amplifier 52. The second sensing switch 512 has one end coupled to reference ground GND, a control end controlled by a voltage source Vcc, and a second end coupled to a second input of sensing amplifier 52. Inductor current IL can be determined by the voltage at switching node SW and the on conduction resistance of switch 33. Thus, by sensing the voltage at the switching node SW, and by matching the on conduction resistance of the second switch 33 to those in sensing transistor module 51, inductor current IL can be sensed.

Sensing amplifier 52 has a first input, a second input, a first output and a second output, wherein the first input and the second input of sensing amplifier 52 are coupled to sensing transistor module 51 configured to sense the current flowing through the second switch 33, the first output of sensing amplifier 52 provides the positive current sensing voltage Vcs+, and the second output of sensing amplifier 52 provides the negative current sensing voltage Vcs−, and wherein the current sensing signal is provided as a differential voltage between the voltage Vcs+ at the first output of sensing amplifier 52 and the voltage Vcs− at the second output of sensing amplifier 52. Sensing amplifier 52 comprises a voltage control module 521, two current mirrors 522 and 523, two resistors 524 and 525, and two voltage followers 526 and 527. Sensing amplifier 52 provides current sensing signal CS as: Vcs=(Vcs+)−(Vcs−)=IL*k, where k is a fixed value determined by N and R, and R is the resistance of resistors 524 and 525.

Sample and hold circuit 53 comprises a first capacitor 531, a second capacitor 532, a first selection switch 533 and a second selection switch 534. The first capacitor 531 has a first end and a second end, wherein the second end of the first capacitor 531 is coupled to a reference ground GND. The second capacitor 532 has a first end and a second end, wherein the second end of the second capacitor 532 is coupled to the reference ground GND. The first selection switch 533 has a first end, a second end and a control end, wherein the first end of the first selection switch 533 is coupled to the first output 355 of the current sensing circuit 35, the second end of the first selection switch 533 is coupled to the first end of the first capacitor 531, and the control end of the first selection switch 533 is coupled to a control signal SH1. The second selection switch 534 has a first end, a second end and a control end, wherein the first end of the second selection switch 534 is coupled to the second output 356 of the current sensing circuit 35, the second end of the second selection switch 534 is coupled to the first end of the second capacitor 532, and the control end of the second selection switch 534 is coupled to the control signal SH1.

When signal SH1 is in a first logic state for example logic HIGH, the first selection switch 533 and the second selection switch 534 are in an ON state, and the differential voltage between the voltage at the first end of the first capacitor 531 and the voltage at the first end of the second capacitor 532 is configured to provide the current sensing signal. The current sensing signal is in differential form as Vcs=(Vcs+)−(Vcs−). During this time period, the current detection signal which aims to indicate the inductor current is determined by the current sensing signal.

When signal SH1 is in a second logic state for example logic LOW, the first selection switch 533 and the second selection switch 534 are in an OFF state, the first output 355 of current sensing circuit 35 is disconnected from the first capacitor 531 and the second output 356 of current sensing circuit 35 is disconnected from the second capacitor 532, and the differential voltage between the voltage at the first end of the first capacitor 531 and the voltage at the first end of the second capacitor 532 is configured to provide the current emulation signal. At this time, current detection signal is determined by the current emulation signal.

Figure 6:
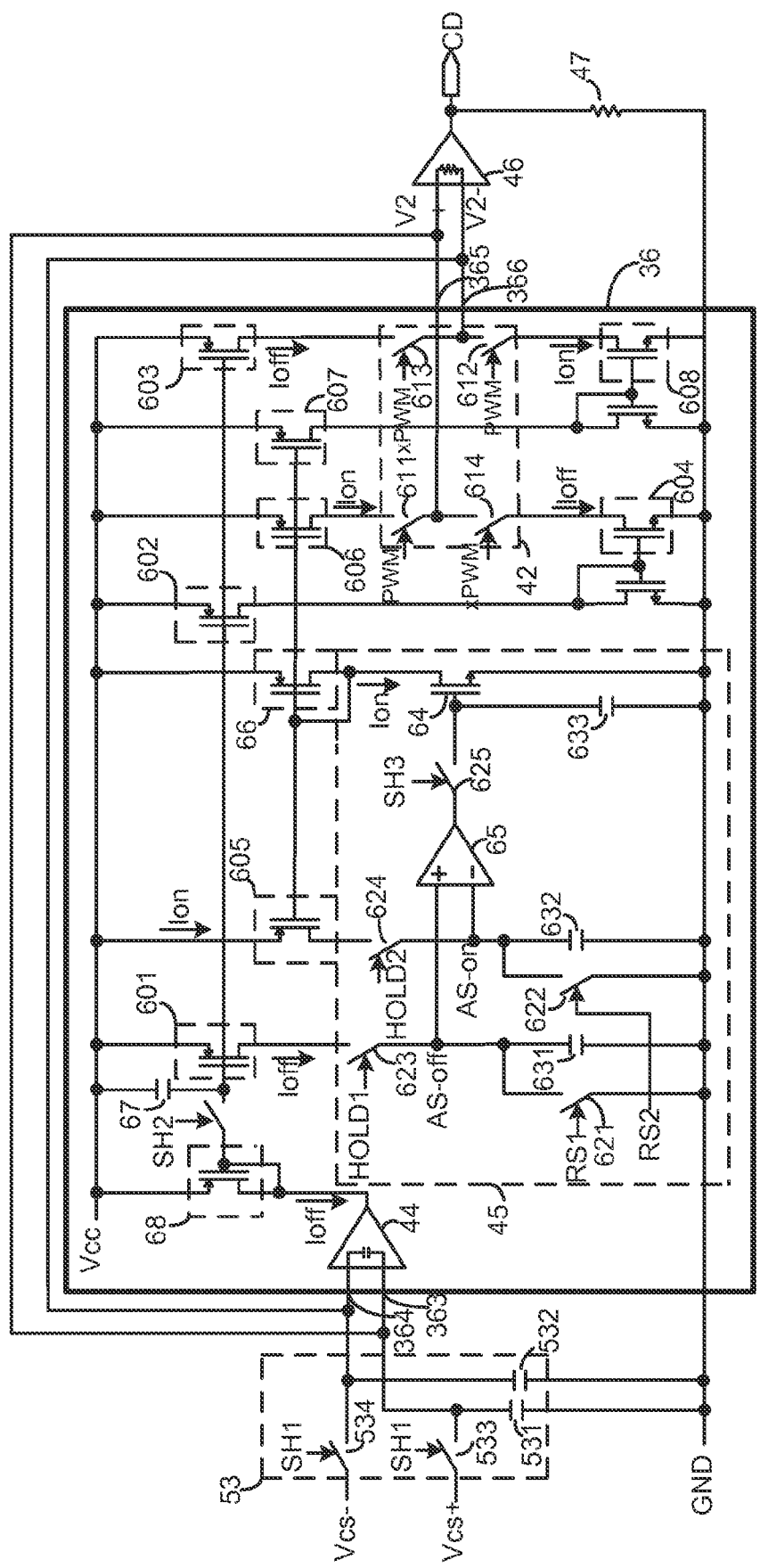
FIG. 6 illustrates a circuit diagram including a current emulation circuit 36, according to an embodiment of the present invention.

FIG. 6 illustrates a circuit diagram including a detailed current emulation circuit 36 according to an embodiment of the present invention. In the shown embodiment, current sensing signal and current emulation signal each is a differential signal, and current sensing signal is indicated as a differential signal between voltage Vcs+ and voltage Vcs−. Accordingly, current emulation circuit 36 has a first input 363, a second input 364, a first output 365 and a second output 366. Wherein the inputs 363 and 364 are configured to receive the differential current sensing signal, and the outputs 365 and 366 are configured to provide the differential current emulation signal.

Current emulation circuit 36 comprises a current converting circuit 44, a signal generating circuit 45, a plurality of current mirrors for forming a plurality of current sources 601-608, and a switching network 42. Further current emulation circuit 36 shares the first capacitor 531 and the second capacitor 532 of a sample and hold circuit 53. Current converting circuit 44 has a first input coupled to the first input 363 of the current emulation circuit 36 to receive a positive current sensing signal Vcs+, a second input coupled to the second input 364 of current emulation circuit 36 to receive a negative current sensing signal Vcs−, and accordingly current sensing signal is obtained as Vcs=(Vcs+)−(Vcs−). Converting circuit 44 converts the current sensing signal into a current source 68 having a first current Ioff. The first current Ioff is sampled and hold by a switch controlled by a signal SH2 and by a capacitor 67, and forms a first current source 601. A plurality of current mirrors mirror the first current Ioff into a plurality of first current sources 602-604 having the first current Ioff.

Signal generating circuit 45 generates and adjusts a second current Ion based on the first current Ioff and forms a second current source 66. A plurality of current mirrors mirror the second current Ion into a plurality of second current sources 605-608. Signal generating circuit 45 comprises an amplifier 65, a first capacitor 631, a second capacitor 632, a first switch 621, a second switch 622, a third switch 623, a fourth switch 624, a fifth switch 625, a first transistor 64, a second transistor 66 and a third transistor 605. Where the first capacitor 631 is coupled between a non-inverting input of comparator 65 and the reference ground GND. The second capacitor 632 is coupled between the inverting input of comparator 65 and the reference ground GND. The first switch 621 is coupled across capacitor 631. The second switch 622 is coupled across capacitor 632. The third switch 623 is coupled between the first current source 601 and capacitor 631. The fourth switch 624 is coupled between the third transistor 605 and capacitor 632. The fifth switch 625 is coupled between an output of comparator 65 and a control end of transistor 64. A third capacitor 633 is coupled between the fifth switch 625 and reference ground GND. The first transistor 64 has a first end coupled to reference ground GND, a second end coupled to the second transistor 66, and a control end coupled to the fifth switch 625. The second transistor 66 and the third transistor 605 form a current mirror to mirror current Ion. The switches 621-625 are controlled by signals RS1, RS2, HOLD1, HOLD2 and SH3 respectively. The first capacitor 631 and the second capacitor 632 have the same capacitance. Signal generating circuit 45 generates and adjusts a second current Ion based on the first current Ioff. The function of signal generating circuit 45 will be described later with reference to the waveform diagram of FIG. 7. In one embodiment, amplifier 65 comprises a transconductance amplifier. In another embodiment, amplifier 65 is replaced by a comparator.

Switching network 42 comprises a plurality of switches 611-614, wherein switches 611 and 612 are coupled to second current sources 606 and 608, and are controlled by a PWM signal which is used for controlling the high-side switch of a buck converter. Switches 613 and 614 are coupled to first current sources 603 and 604 and are controlled by a signal xPWM which is a NOT signal of the PWM signal. A common node between switches 611 and 614 is coupled to the first output 365 of current emulation circuit 36 and further coupled to a first capacitor 531 of sample and hold circuit 53. A common node between switches 612 and 613 is coupled to the second output 366 of current emulation circuit 36 and is further coupled to the second capacitor 532 of sample and hold circuit 53. When control signal SH1 is in a first logic state, for example logic LOW, the first selection switch 533 and the second selection switch 534 are in an OFF state, the second current Ion is configured to charge the first capacitor 531 and discharge the second capacitor 532 when the PWM signal is in a first state for example logic HIGH. And then the first current Ioff is configured to charge the second capacitor 532 and discharge the first capacitor 531 when the PWM signal is in a second state for example logic LOW. The differential voltage between the voltage at the first end of the first capacitor 531 and the voltage at the first end of the second capacitor 532 is configured to provide the current emulation signal indicated by Vce=(V2+)−(V2−).

Transconductance amplifier 46 has a first input, a second input and an output, wherein the first input is coupled to the first end of the first capacitor 351 and the first output 365 of current emulation circuit 36, the second input of transconductance amplifier is coupled to the first end of the second capacitor 352 and the second output 366 of current emulation circuit 36, and the output of transconductance amplifier is coupled to resistor 47 for generating current detection signal CD. During a first period when signal SH1 turns off switches 533 and 534, current detection signal CD is determined by current emulation signal. And during a second period when signal SH1 turns on switches 533 and 534, current detection signal CD is determined by current sensing signal.

Figure 7:
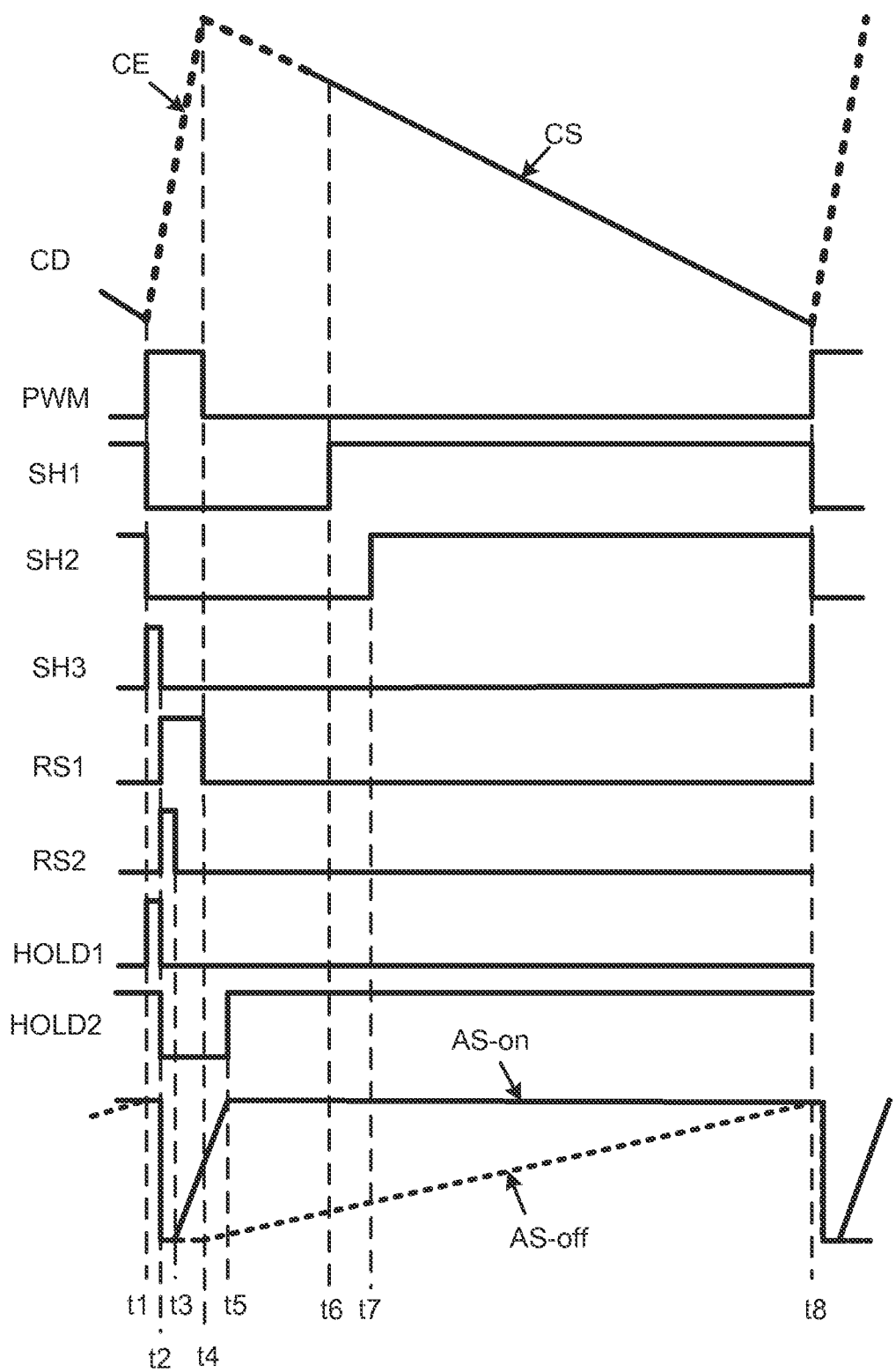
FIG. 7 illustrates a waveform diagram of signals as shown in FIGS. 5-6, according to an embodiment of the present invention.

FIG. 7 illustrates a waveform diagram of signals with reference to circuits in FIGS. 5-6 as an integral according to an embodiment of the present invention. At time t1, PWM signal transits in a first logic state of logic HIGH, switches 611 and 612 are turned on, and switches 613 and 614 are turned off. At the same time, signal SH1 transits in logic LOW, and switches 533 and 534 are turned off to hold the current sensing signal CS by the a first capacitors 531 and a second capacitor 532. The second current Ion starts to charge the first capacitor 531 and discharge the second capacitor 532, and current emulation signal Vce=(V2+)−(V2−) starts to increase. At the same time, signal SH2 transits in logic LOW to hold on the first current Ioff which is indicative of the slope rate of the current sensing signal determined by Vcs+ and Vcs−. At the same time, signal SH3 transits in logic HIGH to turn on switch 625. Signals HOLD1 and HOLD2 are in logic HIGH to have switches 623 and 624 in OFF state, and accordingly on-ramp voltage AS-on and off-ramp voltage AS-off hold on. At this time, if the off-ramp voltage AS-off is lower than the on-ramp voltage AS-on, the voltage at the control end of transistor 64 decreases, and the second current Ion decreases accordingly. And if the off-ramp voltage AS-off is higher than the on-ramp voltage AS-on, the voltage at the control end of switch 64 increases, and the second current Ion increases accordingly. During successive cycles, the second current Ion increases or decreases until that on-ramp voltage AS-on and the off-ramp voltage AS-off are equal. A short time later and at time t2, switch 625 is turned off and the second current Ion holds on which is indicative of the slope of on-ramp voltage AS-on in the next cycle. In one embodiment, the period of t1-t2 is about 10-20 nano-seconds.

From time t1 to t4, since switches 611 and 612 are in ON state, and switches 613 and 614 are in OFF state, the second current Ion from the second current source 606 charges the first capacitor 531, and the second current Ion from the second current source 608 discharges the second capacitor 532, and accordingly the current emulation signal which equals the differential voltage between voltage V2+ and voltage V2− increases.

At time t2, signal SH3 transits in logic LOW to turn off switch 625, and signals RS1 and RS2 transit in logic HIGH to turn on switches 621 and 622. Accordingly, on-ramp voltage AS-on and off-ramp voltage AS-off are reset to zero voltage. At this time, signals HOLD1 and HOLD2 transit in logic LOW to turn on switches 623 and 624. However, signal HOLD1 can either be turned on at anytime before the PWM signal transits in logic LOW, and signal HOLD2 can be turned on at anytime before signal RS2 transits in logic LOW.

At time t3, signal RS2 transits in logic LOW to turn off switch 622. At this time, switch 624 is in ON state and accordingly, the second current Ion from the second current source 605 starts to charge capacitor 632, and on-ramp voltage AS-on starts to increase. On-ramp voltage AS-on increases until at time t5, signal HOLD2 transits in logic HIGH to turn off switch 624, and on-ramp voltage AS-on holds on and keeps in constant value. The time period t3-t5 equals the time of when the PWM signal is in logic HIGH such that the time period of when the on-ramp voltage AS-on increases equals that of when the PWM signal is in logic HIGH. That is the time period of t3-t5 equals the time period of t1-t4. Between time t5 to time t8, on-ramp voltage AS-on is held at (Ion*Ton)/C, where Ton equals the time period of t3 to t5, and C represents the capacitance of capacitor 632.

At time t4, the PWM signal transits in a second logic state of logic LOW. Switches 613 and 614 in switching network 42 are turned on, and switches 611 and 612 in switching network 42 are turned off. The first current Ioff from the first current source 603 starts to charge the second capacitor 532, and the first current Ioff from the first current source 604 starts to discharge the first capacitor 531, and current emulation signal decreases. At the same time, signal RS1 transits in logic LOW to turn off switch 621, and the first current Ioff starts to charge capacitor 631, and the off-ramp voltage AS-off starts to increase. Off-ramp voltage AS-off keeps increasing until the PWM signal transits in logic HIGH again at time t8 such that the time period of when the off-ramp voltage AS-off increases equals that of when the PWM signal is in logic LOW. At time t8, off-ramp voltage AS-off is held at (Ioff*Toff)/C, where Toff is the time period from time t4 to time t8, and C represents the capacitance of capacitor 631. Signal generating circuit 45 aims to control off-ramp voltage AS-off equaling on-ramp voltage AS-on, and it satisfies that: (Ion*Ton)/C=(Toff*Toff)/C, and thus Ion is calculated by Ion=Ioff*Toff/Ton. Since Toff equals the time when the PWM signal is in logic LOW, and Ton equals the time when the PWM signal is in logic HIGH. Thus, it is controlled that Ion=Ioff*Toff/Ton=Ioff*(1−D)/D, where D is the duty cycle of the PWM signal. And thus the current emulation signal may match the real inductor current with high accuracy.

At time t6, signal SH1 transits into logic HIGH to turn on switches 533 and 534, thus to couple the output voltages Vcs+ and Vcs− to the output stage of the current detection circuit. At that time, the first current Ioff provided at the outputs 365 and 366 of current emulation circuit 36 will be absorbed by the voltage followers 526 and 527 of current sensing circuit 35, and current detection signal CD starts to be determined by the current sensing signal indicated by a differential voltage between the voltages Vcs+ and Vcs−. Time t6 is selected that at this time point, current sensing signal CS is capable of indicating the inductor current with high accuracy.

At time t7, signal SH2 transits into logic HIGH and the first current Ioff in the first current sources 601-604 are regulated by the current sensing signal indicated by voltages Vcs+ and Vcs−. Time t7 is selected that the current sensing signal has indicated the inductor current with high accuracy for a time period.

At time t8, the PWM signal transits into logic HIGH again, off-ramp voltage AS-off is held at (Ioff*Toff)/C. It repeats the control with that at time t1 and a new cycle begins.

During a first period between time t1-t6, signal SH1 is in logic LOW and the current detection signal CD is determined by the current emulation signal CE. And during a second period between time t6-t8, signal SH1 is in logic HIGH, and the current detection signal CD is determined by the current sensing signal CS. In a particular embodiment, the current detection signal CD equals the current emulation signal CE during the first period and equals the current sensing signal CS during the second period. In this way, the second period comprises a part of the time when the PWM signal is in logic LOW and the second switch (low-side switch of a buck converter) is in the ON state, and the first period comprises the time of when the PWM signal is in logic HIGH and the time at the beginning of the PWM signal is in logic LOW. Thus the trimming of the current sensing signal at the beginning of when the PWM signal is in logic LOW does not appear in the current detection signal which leads to a higher accuracy, and further the transition between periods of PWM HIGH and PWM LOW is quite smooth.

It should be known that the logic states of logic HIGH and logic LOW of a logic signal may be exchanged while having the same control.

Figure 8:
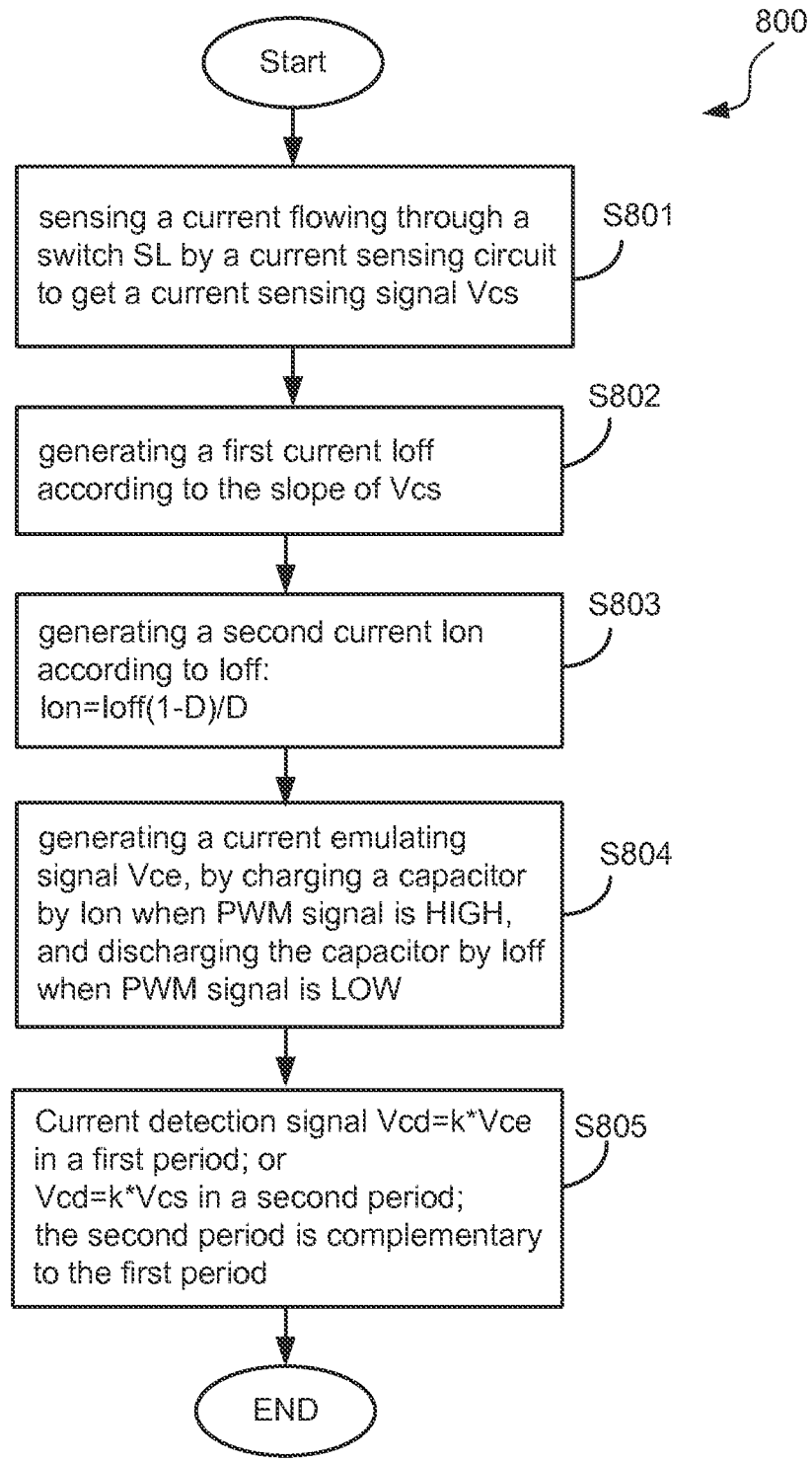
FIG. 8 illustrates a flow chart diagram of an inductor current detecting method, according to an embodiment of the present invention.

FIG. 8 illustrates a flow chart diagram of a method 800 of detecting an inductor current in a SMPS, according to an embodiment of the present invention. The SMPS comprises a first switch, a second switch, and an inductor which is coupled to the first switch and the second switch. When a PWM signal is in a first state, for example logic HIGH, the first switch is turned on, and a current flowing through the first switch equals an inductor current flowing through the inductor. When the PWM signal is in a second state for example logic LOW, the second switch is turned on, and a second switch current flowing through the second switch equals the inductor current. Method 800 comprises in step S801 sensing a current flowing through a switch, for example sensing the current flowing through a switch SL by a current sensing circuit to get a current sensing signal Vcs. Method 800 comprises in step S802 generating a first current Ioff according to the slope of the current sensing signal Vcs. Method 800 comprises in step S803 generating a second current Ion according to the first current Ioff. In one embodiment, the second current Ion is controlled as Ion=Ioff(1−D)/D, where D is a duty cycle of the PWM signal. Method 800 comprises in step S804 generating a current emulation signal Vce according to the first current Ion and the second current Ioff. In one embodiment, the current emulation signal Vce is obtained by charging a capacitor when the PWM signal is in the first state, and discharging the capacitor when the PWM signal is in the second state. Method 800 further comprises in step S805 detecting the inductor current by adopting the current emulation signal in a first period and adopting the current sensing signal in a second period. In one embodiment, the second period is complementary to the first period. And in another embodiment, not all the current detection signal is desired, and the first period and the second period are not successive. In one embodiment, the second period comprises a part of the time when the PWM signal is in the second state and when switch SL is in ON state, and the first period is complementary to the second period.

Method 800 may further comprises getting a voltage signal according to the current sensing signal and the current emulation signal, converting the voltage signal into a current signal by a transconductance amplifier, and then converting the current signal into a current detection signal indicative of the inductor current. In one embodiment, the voltage signal equals the current emulation signal at the first period, and the voltage signal equals the current sensing signal at the second period.

This method may emulates the inductor current during the whole period when the PWM signal is in the first logic state and a part of the time period when the PWM signal is in the second logic state. And the current detection signal adopting the current emulation signal has neither signal trimming nor high transition fluctuation, and may match the real inductor current with high accuracy.

Figure 9:
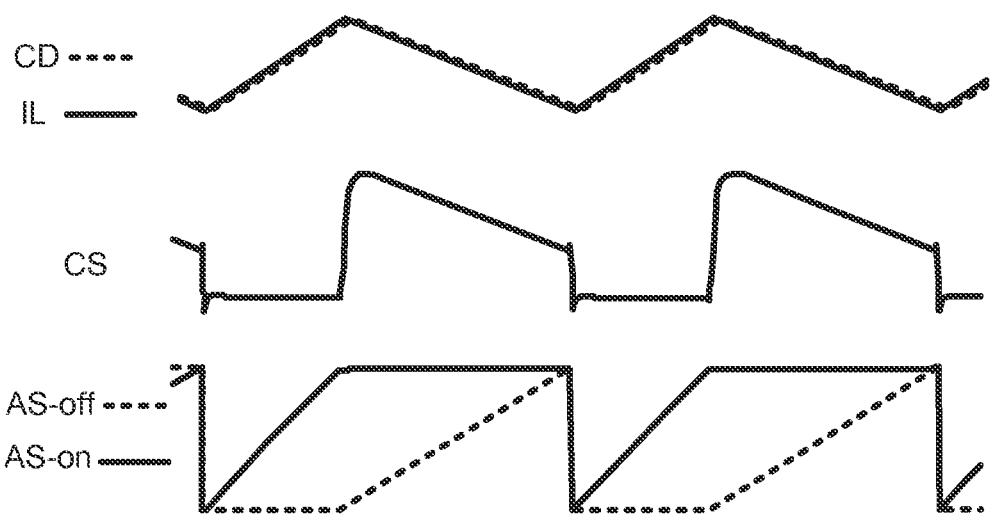
FIG. 9 illustrates a waveform diagram of some simulation signals with reference to FIGS. 5-6, according to an embodiment of the present invention.

FIG. 9 illustrates a waveform diagram of some simulation signals in a SMPS with reference to FIGS. 5-6 according to an embodiment of the present invention. From the diagram, it can be seen that the current detection signal CD with current emulation signal CE matches inductor current IL with high accuracy.

Figure 10:
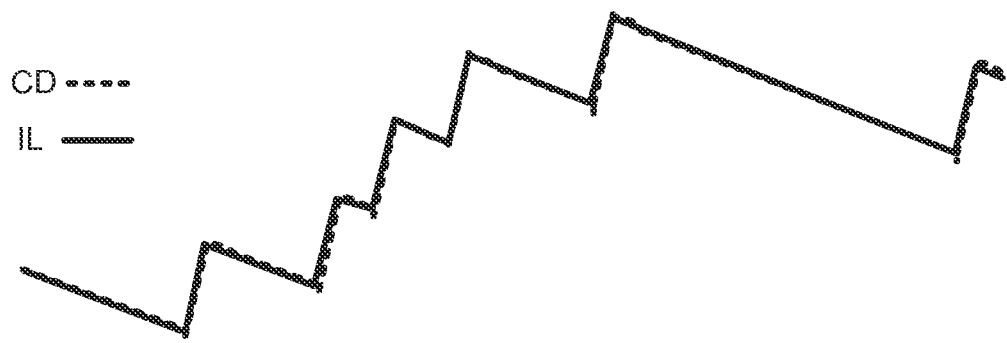
FIG. 10 illustrates a diagram of simulation signals with reference to FIGS. 5-6 during a load up-transient, according to an embodiment of the present invention.

FIG. 10 illustrates a diagram of simulation signals in a SMPS with reference to FIGS. 5-6 during a load up-transient according to an embodiment of the present invention. From the diagram, it can be seen that during the load up-transient, current detection signal CD can also match inductor current IL very well.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A current detection circuit for detecting a current in a SMPS, wherein the SMPS having a first switch and a second switch, the current equaling a first switch current flowing through the first switch when a PWM signal is in a first state and equaling a second switch current flowing through the second switch when the PWM signal is in a second state different from the first state, the current detection circuit comprising:
   a current sensing circuit for sensing the second switch current, the current sensing circuit having a first input, a second input and an output, wherein the first input of the current sensing circuit is coupled to a first end of the second switch, the second input of the current sensing circuit is coupled to a second end of the second switch, and the output of the current sensing circuit is configured to provide a current sensing signal indicative of the second switch current; and
   a current emulation circuit having an input and an output, wherein the input of the current emulation circuit is configured to receive the current sensing signal, and the output of the current emulation circuit is configured to provide a current emulation signal, wherein the current emulation circuit provides a first current generated based on the current sensing signal and provides a second current generated based on the first current, and further wherein the current emulation signal is generated based on the first current and the second current; wherein
   the current detection circuit is configured to provide a current detection signal indicative of the current in the SMPS, and wherein the current detection signal is proportional to the current emulation signal with a predetermined proportion during a first period, and the current detection signal is proportional to the current sensing signal with the same predetermined proportion during a second period.

2. The current detection circuit of claim 1, wherein the second period comprises a part of the time when the second switch is in an ON state, and wherein the second period is complementary to the first period.

3. The current detection circuit of claim 1, wherein the current emulation circuit comprises:
   a converting circuit having an input and an output, wherein the input of the converting circuit is configured to receive the current sensing signal, and the output of the converting circuit is configured to provide the first current, and wherein the first current is proportional to the slope of the current sensing signal;
   a signal generating circuit configured to provide the second current based on the first current; and
   a switching network configured to charge a capacitor by the second current when the PWM signal is in the first state and accordingly the current emulation signal increases, and the switching network configured to discharge the capacitor by the first current when the PWM signal is in the second state and accordingly the current emulation signal decreases.

4. The current detection circuit of claim 3, wherein the signal generating circuit is configured to generate the second current by an equation that: Ion=Ioff*(1−D)/D, where Ion represents the second current, Ioff represents the first current, and D represents a duty cycle of the PWM signal.

5. The current detection circuit of claim 3, wherein the signal generating circuit comprises:
   an amplifier having a first input, a second input and an output;
   a first capacitor coupled between the first input of the amplifier and a reference ground;
   a second capacitor coupled between the second input of the amplifier and the reference ground;
   a first switch coupled across the first capacitor of the signal generating circuit;
   a second switch coupled across the second capacitor of the signal generating circuit;
   a third switch coupled between a first current source having the first current and the first capacitor of the signal generating circuit, wherein the third switch is configured to be turned on with a time period equal to when the PWM signal is in the second state;
   a fourth switch having a first end and a second end, wherein the first end of the fourth switch is coupled to the second capacitor of the signal generating circuit, and wherein the fourth switch is configured to be turned on with a time period equal to when the PWM signal is in the first state;
   a fifth switch having a first end, a second end and a control end, wherein the first end of the fifth switch is coupled to the output of the amplifier;
   a first transistor having a first end, a second end and a control end, wherein the control end of the first transistor is coupled to the second end of the fifth switch, and wherein the second current is generated between the first end of the first transistor and the second end of the first transistor, and the second current is adjusted when the fifth switch is in an ON state;
   a second transistor coupled in series with the first transistor; and
   a third transistor coupled to the second end of the fourth switch, and wherein the third transistor and the second transistor are configured to form a current mirror.

6. The current detection circuit of claim 3, wherein the signal generating circuit comprises:
   a comparator having a first input, a second input and an output;
   a first capacitor coupled between the first input of the comparator and a reference ground;
   a second capacitor coupled between the second input of the comparator and the reference ground;
   a first switch coupled across the first capacitor of the signal generating circuit;
   a second switch coupled across the second capacitor of the signal generating circuit;
   a third switch coupled between a first current source having the first current and the first capacitor, wherein the third switch is configured to be turned on with a time period equaling when the PWM signal is in the second state;
   a fourth switch having a first end and a second end, wherein the first end of the fourth switch is coupled to the second capacitor, and wherein the fourth switch is configured to be turned on with a time period equaling when the PWM signal is in the first state;
   a fifth switch having a first end, a second end and a control end, wherein the first end of the fifth switch is coupled to the output of the comparator;
   a first transistor having a first end, a second end and a control end, wherein the control end of the first transistor is coupled to the second end of the fifth switch, and wherein the second current is generated between the first end of the first transistor and the second end of the first transistor and the second current is adjusted when the fifth switch is in an ON state;
   a second transistor coupled in series with the first transistor; and
   a third transistor coupled to the second end of the fourth switch, and wherein the third transistor and the second transistor are configured to from a current mirror.

7. The current detection circuit of claim 1, wherein the SMPS comprises a buck converter, the first switch comprises a high-side switch of the buck converter, and the second switch comprises a low-side switch of the buck converter.

8. The current detection circuit of claim 1, wherein when the PWM signal is in the first state, the first switch is configured to be turned on and the second switch is configured to be turned off; and wherein when the PWM signal is in the second state, the second switch is configured to be turned on and the first switch is configured to be turned off.

9. The current detection circuit of claim 1, further comprising:
   a selection switch, having a first end and a second end, wherein the first end is coupled to the output of the current sensing circuit;
   a transconductance amplifier having an input and an output, wherein the input of the transconductance amplifier is coupled to the output of the current emulation circuit and the second end of the selection switch, and the output of the transconductance amplifier is configured to provide a current signal; and
   a resistor having a first end and a second end, wherein the first end of the resistor is coupled to the output of the transconductance amplifier and the second end of the resistor is coupled to a reference ground, and wherein the first end of the resistor is configured to provide the current detection signal.

10. The current detection circuit of claim 1, wherein the current sensing circuit has a first output and a second output, and the current emulation circuit has a first input and a second input, and the current detection circuit further comprising:
   a first capacitor having a first end and a second end, wherein the second end of the first capacitor is coupled to a reference ground;
   a second capacitor having a first end and a second end, wherein the second end of the second capacitor is coupled to the reference ground;
   a first selection switch having a first end, a second end and a control end, wherein the first end of the first selection switch is coupled to the first output of the current sensing circuit, the second end of the first selection switch is coupled to the first end of the first capacitor and the first input of the current emulation circuit, and the control end of the first selection switch is coupled to a control signal; and
   a second selection switch having a first end, a second end and a control end, wherein the first end of the second selection switch is coupled to the second output of the current sensing circuit, the second end of the second selection switch is coupled to the first end of the second capacitor and the second input of the current emulation circuit, and the control end of the second selection switch is coupled to the control signal; wherein when the control signal is in a first logic state, the first selection switch and the second selection switch are in an ON state, and the differential voltage between the voltage at the first end of the first capacitor and the voltage at the first end of the second capacitor is configured to provide the current sensing signal; and when the control signal is in a second logic state, the first selection switch and the second selection switch are in an OFF state, and the differential voltage between the voltage at the first end of the first capacitor and the voltage at the first end of the second capacitor is configured to provide the current emulation signal, wherein when the PWM signal is in the first state, the second current is configured to charge the first capacitor and discharge the second capacitor, and when the PWM signal is in the second state, the first current is configured to charge the second capacitor and discharge the first capacitor.

11. The current detection circuit of claim 10, further comprising:

a transconductance amplifier having a first input, a second input and an output, wherein the first input of the transconductance amplifier is coupled to the first end of the first capacitor, the second input of the transconductance amplifier is coupled to the first end of the second capacitor, and the output of the transconductance amplifier is configured to convert the differential voltage between the voltage at the first end of the first capacitor and the voltage at the first end of the second capacitor into a current signal; and a resistor having a first end and a second end, wherein the first end of the resistor is coupled to the output of the transconductance amplifier and the second end of the resistor is coupled to a reference ground, and wherein the first end of the resistor is configured to provide the current detection signal.

12. The current detection circuit of claim 1, wherein the current sensing circuit comprises:

a sensing transistor module having a first end, a second end, a third end and a fourth end, wherein the first end of the sensing transistor module is coupled to a first end of the second switch, the second end of the sensing transistor module is coupled to a second end of the second switch, and the third end of the sensing transistor module is coupled to a control end of the second switch, and wherein the sensing transistor module and the second switch are integrated on a same semiconductor substrate; and a sensing amplifier coupled to the fourth end of the sensing transistor module, wherein the sensing amplifier is configured to provide the current sensing signal.

13. A current emulation circuit for emulating an inductor current in a SMPS and providing a current emulation signal based on a current sensing signal, the SMPS having a first switch, a second switch and an inductor coupled to the first switch and the second switch, wherein the inductor current flowing through the inductor equaling a first switch current flowing through the first switch when a PWM signal is in a first state and equaling a second switch current flowing through the second switch when the PWM signal is in a second state different from the first state, wherein the current sensing signal is indicative of the second switch current, the current emulation circuit comprising:

a converting circuit having an input and an output, wherein the input of the converting circuit is configured to receive the current sensing signal, and the output of the converting circuit is configured to provide a first current, and wherein the first current is proportional to the slope of the current sensing signal;

a signal generating circuit configured to provide a second current based on the first current; and a switching network configured to charge a capacitor by the second current when the PWM signal is in the first state and accordingly the current emulation signal increases, and the switching network configured to discharge the capacitor by the first current when the PWM signal is in the second state and accordingly the current emulation signal decreases.

14. The current emulation circuit of claim 13, wherein the signal generating circuit is configured to generate the second current by an equation that: $Ion=Ioff*(1-D)/D$, where Ion represents the second current, Ioff represents the first current, and D represents a duty cycle of the PWM signal.

15. The current emulation circuit of claim 13, wherein the signal generating circuit comprises:

an amplifier having a first input, a second input and an output;

a first capacitor coupled between the first input of the amplifier and a reference ground;

a second capacitor coupled between the second input of the amplifier and the reference ground;

a first switch coupled across the first capacitor of the signal generating circuit;

a second switch coupled across the second capacitor of the signal generating circuit;

a third switch coupled between a first current source having the first current and the first capacitor of the signal generating circuit, wherein the third switch is configured to be turned on with a time period equal to when the PWM signal is in the second state;

a fourth switch having a first end and a second end, wherein the first end of the fourth switch is coupled to the second capacitor of the signal generating circuit, and wherein the fourth switch is configured to be turned on with a time period equal to when the PWM signal is in the first state;

a fifth switch having a first end, a second end and a control end, wherein the first end of the fifth switch is coupled to the output of the amplifier;

a first transistor having a first end, a second end and a control end, wherein the control end of the first transistor is coupled to the second end of the fifth switch, and wherein the second current is generated between the first end of the first transistor and the second end of the first transistor, and the second current is adjusted when the fifth switch is in an ON state;

a second transistor coupled in series with the first transistor; and a third transistor coupled to the second end of the fourth switch, and wherein the third transistor and the second transistor are configured to form a current mirror.

16. The current emulation circuit of claim 13, wherein the SMPS comprises a buck converter, the first switch comprises a high-side switch of the buck converter and the second switch comprises a low-side switch of the buck converter.

17. The current emulation circuit of claim 13, further comprising:

a transconductance amplifier having an input and an output, wherein the input of the transconductance amplifier is coupled to the capacitor, and the output of the transconductance amplifier is configured to provide a current signal; and a resistor having a first end and a second end, wherein the first end of the resistor is coupled to the output of the transconductance amplifier, and the second end of the resistor is coupled to a reference ground, and wherein the first end of the resistor is configured to provide the current emulation signal.

18. A method of detecting an inductor current in a SMPS, the method comprising:
sensing a current flowing through a switch of the SMPS by a current sensing circuit to get a current sensing signal;
generating a first current based on the slope of the current sensing signal;
generating a second current based on the first current;
generating a current emulation signal according to the first current and the second current; and
detecting the inductor current by adopting the current emulation signal in a first period and adopting the current sensing signal in a second period, wherein the first period is complementary to the second period.

19. The method of claim 18, wherein generating a second current according to the first current satisfies an equation that: $Ion=Ioff*(1-D)/D$, where Ion represents the second current, Ioff represents the first current, and D represents a duty cycle of a PWM signal for controlling a main switch of the SMPS.

20. The method of claim 18, wherein generating the current emulation signal based on the first current and the second current comprises charging or discharging at least a capacitor by the first current and the second current sequentially.

* * * * *